(12) United States Patent
Hager

(10) Patent No.: US 7,288,842 B2
(45) Date of Patent: Oct. 30, 2007

(54) POWER SEMICONDUCTOR MODULE WITH AUXILIARY CONNECTION

(75) Inventor: Ludwig Hager, Nürnberg (DE)

(73) Assignee: Semikron Elektronik GmbH & Co KG, Nuremberg (DE)

( * ) Notice: Subject to any disclaimer, the term of this patent is extended or adjusted under 35 U.S.C. 154(b) by 96 days.

(21) Appl. No.: 11/297,690

(22) Filed: Dec. 8, 2005

(65) Prior Publication Data

US 2006/0152952 A1 Jul. 13, 2006

(30) Foreign Application Priority Data

Dec. 8, 2004 (DE) .................. 10 2004 058 946

(51) Int. Cl.
*H01L 23/34* (2006.01)

(52) U.S. Cl. ................ 257/726; 257/500; 257/E23.078

(58) Field of Classification Search .................. 257/726
See application file for complete search history.

(56) References Cited

U.S. PATENT DOCUMENTS 5,866,944 A * 2/1999 Hiyoshi et al. ............. 257/719

* cited by examiner

*Primary Examiner*—Tu-Tu Ho
(74) *Attorney, Agent, or Firm*—Lackenbach Siegel, LLP; Andrew F. Young

(57) ABSTRACT

Introduced is a power semiconductor module preferably a disk cell with a power semiconductor element arranged in the interior of the housing. In a preferred embodiment, the disk cell has two load and at least one auxiliary connection and the auxiliary connection extends from the power semiconductor element and ends at a corresponding exterior connection element. The exterior connection element of the auxiliary connection penetrates the housing and is a pen-type metal preform in the interior.

18 Claims, 3 Drawing Sheets

POWER SEMICONDUCTOR MODULE WITH AUXILIARY CONNECTION

CROSS REFERENCE TO RELATED APPLICATIONS

The present invention claims priority from DE 10 2004 058 946.1, filed Dec. 8, 2004, the contents of which are fully incorporated herein by reference.

BACKGROUND OF THE INVENTION

1. Field of the Invention

The present invention relates to a secure auxiliary connection contact system for a power semiconductor module having a power semiconductor component with an external connection element arrangement. More specifically, the present invention relates to an auxiliary connection system including a crimp element that employs a clamping or crimping action relative to a pen-type metal connection element.

2. Description of the Related Art

Known are various embodiments of power semiconductor modules, for example with a substrate with a plurality of power semiconductor components arranged thereon and a surrounding plastic housing. Some such power semiconductor modules also have metal base plates. Also known are disk cells with a tightly sealed housing and mostly only one single semiconductor component inside. As will be discussed in the full inventive review below, the presently proposed embodiments are suitable for all types of power semiconductor modules but have inventive advantages especially for disk cells.

As is shown in DE 101 32 169 A1 such disk cells are commonly comprised of a cylinder-shaped insulating body as housing, for example. Arranged therein is at least one power semiconductor component, for example a power diode, a power transistor, or a power thyristor.

According to the state of the art the auxiliary connections of a disk cell are designed as a contact device for connecting the auxiliary connection with the auxiliary connection contact of the power semiconductor component, a connection element and a contact element for connecting to an external connection element, usually a through-plate of the housing.

Conventionally, the contact device for connecting the auxiliary connection with the auxiliary connection contact of the power semiconductor component usually is either a rigid soldered connection or a weak flush connection, the flush connection is usually obtained solely through pressure contact alone. Soldered connections usually are disadvantageous since they have the shortest life compared to other connections. A variety of through-plated connections are known and a newer version is disclosed in the non-published DE 10 2004 050 588.

Based on these conventional contact devices, the auxiliary connection usually is conventionally comprised of an electrically insulated wire element that is rigidly soldered or welded to the connection element. The welded connection is advantageous in that it has a higher degree of rigid durability but is substantially costs, difficult to automate, and may generate detrimental waste products.

Similarly, all conventional flush connections are disadvantageous in that their production causes the inside of the disk cell, in particular one of the load connection contacts in close proximity, to be contaminated which has a consequential negative impact on its durability, reliability, and cost.

In addition, soldered connections are disadvantageous in that the production of a soldered connection for the external connection necessarily loosens the internal soldered connection.

Consequently, what is not appreciated by the prior art is the need for a power semiconductor module having an auxiliary connection that is reliable, easy to assemble during a manufacturing process, and allows durability with easy adaptation to a number of alternative designs and geometries.

Accordingly, there is a need for an improved auxiliary connection system for a power semiconductor module.

OBJECTS AND SUMMARY OF THE INVENTION

The invention here mainly concerns those disk cells with one or more controlled power semiconductor components on an inside region, but those skilled in the art will recognize that the present invention may be adapted to other designs requiring reliable and easily automated electrical connection system, for example substrates having one or more power semiconductor components arranged thereon.

Therefore, the present invention is described with reference using the example of a conventional disk cell for convenience only, but is certainly not limited to this configuration as will be understood upon a complete review and consideration of other power connection needs in the electronics industry.

Proposed is a power semiconductor module with a secure internal connection of an auxiliary connection contact to a power semiconductor component or power semiconductor substrate or unit, having an external connection element arranged therein.

The auxiliary connection therefore mainly is the connection of the control connection of the power semiconductor module extending to an external control connection contact. However, these terms may also subsume auxiliary emitting connections or connections for sensors that are integrated in the power semiconductor module without departing from the spirit and scope of the present invention.

An object of the present invention is to provide a secure and durable electrical connection for a power semiconductor module, often containing a substrate, wherein the module employs an auxiliary connection from a power semiconductor component or track conductors of the substrate to an external connection element.

Another object of the present invention is to introduce a power semiconductor module, preferably a disk cell, with an external connection element for auxiliary connections of a power semiconductor component or a substrate that allows for a secure and durable electric connection and is easily assembled.

Another object of the present invention is to provide a power semiconductor module that includes a housing, at least one power semiconductor component arranged in the interior of the housing as well as at least two load elements and at least one auxiliary component.

Another object of the present invention, particularly in a power semiconductor module designed as a disk cell, is to provide a housing that is easily hermetically sealed and easily enclosable with regard to exterior connection elements.

Another object of the present invention is to provide a power semiconductor module that provides at least one auxiliary connection that runs from a power semiconductor component, preferably from its control connection contact.

In an alternative object of the present invention the auxiliary connection can also be based on the substrate. The respective auxiliary connection ends at a corresponding exterior connection element in which the respective exterior element penetrates the housing and inside the housing the connection element is a conductive extending or pin-type metal element or preform.

According to another alternative object of the present invention, the auxiliary connection itself is comprised of a contact device on the auxiliary connection contact of the power semiconductor component or a corresponding connecting contact of the substrate respectively, and continues by means of a conductive connection element and ends in a contact element that partially is a clamp disk. The clamp disk being arranged on a conductive pin-type metal preform of the exterior connection element.

Another alternative embodiment of the contact element provides a metal preform with a crimp connection with the preferably electrically insulating connecting wire element. The crimp disk is an exterior ring with a plurality, preferably three or five, of exposed and spring-engagable crimp lips. As used herein crimp lips may also be referred to as clamping fingers or clamping members since they employ a secure elastic and friction based electrical connection with the external connection element as will be understood from the drawings and discussion.

According to another alternative embodiment of the present invention, the contact device or connection system on the auxiliary contact of the power semiconductor component, preferably includes a plastic preform or fixture member for positionally fixing a contact peg and providing a positional stabilization relative to a connection point, and as a spring element enabling a pressure contact connection or spring-urging of the contact peg with the auxiliary contact of the power semiconductor component.

The present invention relates to a power semiconductor module preferably a disk cell with a power semiconductor element arranged in the interior of the housing. In a preferred embodiment, the disk cell has two load areas and at least one auxiliary connection there between, and the auxiliary connection extends from the power semiconductor element and ends at a corresponding exterior connection element. The exterior connection element of the auxiliary connection penetrates the housing and is a conductive or pen-type metal perform member in the interior. The auxiliary connection is comprised of a contact device on the auxiliary connection contact of the power semiconductor element, a conductive connection element and a contact element that partially is a crimp disk and the crimp disk is arranged on the pen-type metal preform of the exterior connection element.

According to an embodiment of the present invention there is provided a power semiconductor module with a housing 300, at least one power semiconductor element 200 arranged in the interior of the housing 300, at least two load type elements 190 wherein a main element is helped by a supporting element and at least one auxiliary connection 100 wherein at least the one auxiliary connection 100 extends from the power semiconductor element 200 and/or a substrate and ends at a corresponding exterior connection element 310, wherein at least the one exterior connection element 310 of the at least one auxiliary connection 100 penetrates the housing 300 and is a conductive pen-type metal preform or element in the interior and wherein the auxiliary connection 100 is comprised of a contact device 140 on the auxiliary connection contact of the power semiconductor component 200 or the substrate, a conductive connection element 120 and a contact element 110 part of which is a crimp disk 114 wherein the crimp disk 114 is arranged on the conductive pen-type metal preform of the exterior connection element 310.

According to another embodiment of the present invention there is provided a power semiconductor module, wherein: the contact element 110 is a metal preform with a crimp connection 112 for a crimp connection with the connection element 120 that is a wire element 122 and the crimp disk 112 that is an exterior ring 118 with a plurality of exposed crimp lips 116.

According to another embodiment of the present invention there is provided a power semiconductor module, wherein: the crimp lips 116 are bent forward from the plane formed by the exterior ring 118 in the direction of the interior of the power semiconductor module.

According to another embodiment of the present invention there is provided a power semiconductor module, wherein: the contact device 140 has a plastic preform member on the auxiliary connection contact of the power semiconductor component 200 for fastening a contact peg 124 and a spring element to provide a pressure contact connection of the contact peg 124 with the auxiliary connection contact of the power semiconductor component 200.

According to another embodiment of the present invention there is provided a power semiconductor module, wherein: the power semiconductor module is a disk cell whose housing 300 is easily hermetically sealable tight with the exterior connection element 310 and the substrate is an auxiliary plate in the interior of the housing.

According to another embodiment of the present invention there is provided a power semiconductor module, the power semiconductor module including a housing, at least one power semiconductor element arranged in an interior region of the housing, and at least one auxiliary connection, wherein: the at least one auxiliary connection extends between at least one of the power semiconductor element and a substrate, and a corresponding exterior connection element, the at least one exterior connection element penetrating the housing to an exterior region and enabling an electrical connection thereto, the at least one exterior connection element including a pen-type metal preform projecting into the interior region, the auxiliary connection further comprising: a contact device contacting an auxiliary connection contact of the one of the power semiconductor element and the substrate, a conductive connection element, and a contact element, and the contact element including a crimp disk means for engaging the exterior connection element in a spring-crimp electrical connection, whereby a reliable electrical connection is enabled spanning the interior region.

According to another alternative embodiment of the present invention there is provided a power semiconductor module, wherein: the contact element crimp disk means for engaging includes a first crimp connection means for engaging a wire element of the contact device and an exterior ring member further comprising a plurality of exposed crimp lips members.

According to another alternative embodiment of the present invention there is provided a power semiconductor module, wherein: the crimp lip member are bent forward from a plane formed by the exterior ring member contacting the interior region of the power semiconductor module.

According to another alternative embodiment of the present invention there is provided a power semiconductor module, wherein: the contact device further comprises: a plastic preform member on the auxiliary connection contact member of the power semiconductor component for fastening a contact peg member and a spring element, thereby providing an urging pressure contact connection on the contact peg member with the auxiliary connection contact of the power semiconductor component.

According to another alternative embodiment of the present invention there is provided a power semiconductor module, wherein: the power semiconductor module is a disk cell, the housing further comprises: means for hermetically sealing the interior region of the housing with the exterior connection element, and the substrate is an auxiliary plate in the interior region of the housing.

According to another alternative embodiment of the present invention there is provided a connection system, for electrically connecting at least one power semiconductor element in an interior region of a bounding housing with an exterior region of the housing, comprising: an exterior connection element electrically penetrating the bounding housing from the exterior region and enabling an electrical connectivity with the interior region, at least one means for enabling an elastic electrical connection between the exterior connection element and the at least one power semiconductor element, the means for enabling an elastic electrical connection, further comprising: a contact element, an auxiliary connection contact, the auxiliary connection contact electrically connecting between the at least one power semiconductor element at a first end and the contact element at a second end, means for forming a first crimp engagement between the second end of the auxiliary connection contact and the contact element, and means for forming a second elastic crimp engagement with a portion of the exterior connection element, whereby the means for enabling ensures a quickly assembled elastic electrical connection between the exterior connection element and the at least one contact element.

According to another alternative embodiment of the present invention there is provided a connection system, wherein: the first end of the auxiliary connection contact includes a cylindraceous electrical contact region, the means for forming a first crimp engagement further comprises: a plurality of flexible crimp members for bounding an outer surface of the cylindraceous electrical contact region of the first end, the means for forming a second elastic crimp engagement on the contact element further comprises: a plurality of flexible crimping lips extending inwardly from an outer crimp ring and defining a receiving region there between for elastically crimping the second end of the exterior connection element electrically, whereby the means for forming a second elastic crimp engagement enables a reliable non-rigid electrical connection with the at least one power semiconductor element.

According to another alternative embodiment of the present invention there is provided a connection system, wherein: a contact surface is defined between the outer crimp ring and an inner surface of the bounding housing, the plurality of flexible crimping lips projecting away from the contact surface at a first angle for elastically crimping the second end of the exterior connection element.

According to another alternative embodiment of the present invention there is provided a connection system, wherein: the auxiliary connection contact includes a fastening peg member on the first end of the contact element for electrically contacting the power semiconductor element, securing means for pivotally and elastically securing the fastening peg member element to the power semiconductor element, spring means for elastically urging the fastening peg member into a pressure contact connection with the power semiconductor element, and the spring means pivotally secured within the securing means, whereby the connection system enables a secure and reliable electrical connection between the power semiconductor element sand the exterior connection element.

According to another alternative embodiment of the present invention there is provided a connection system, further comprising: means for hermetically sealing the bounding housing from the exterior region of the housing, whereby the means for hermetically sealing minimizes unintended contamination of the interior region.

According to another alternative embodiment of the present invention there is provided a connection system, for enabling an electrical connection between a power semiconductor element and an exterior connection location, comprising: a conductive connection element for electrically conducting from the power semiconductor element at a first end, to the exterior connection location a second end, a contact device proximate the first end of the conductive connection element including first means for elastically and electrically contacting the first end of the connection element to the power semiconductor element, a contact element proximate the second end of the conductive connection element for electrically contacting the conductive connection element to at least one exterior connection element proximate the exterior connection location, the contact element including at least a conductive crimp disk portion, and second means for forming an elastic and electrically secure electrical connection between a projecting portion of the exterior connection element and the second end of the conductive connection element.

According to another alternative embodiment of the present invention there is provided a connection system, further comprising: a crimp connection member on the contact element, and the crimp connection member including at least one deformable member for securing at least a portion of the second end of the conductive connection element to the contact element.

According to another alternative embodiment of the present invention there is provided a connection system, wherein: the second means for forming further comprises: a plurality of semi-flexible conductive crimp fingers projecting from the conductive crimp disk, the fingers defining a central recess for receiving the projecting portion of the exterior connection element, and the central recess for receiving having an inner opening dimension less than an outer dimension of the projecting portion, whereby at least one of the plurality of conductive crimp fingers semi-flexibly engages and frictionally contacts the projecting portion, and secure an electrically conductive connection to the exterior connection element.

According to another alternative embodiment of the present invention there is provided a connection system, wherein: a plane is defined along bottom surface of the conductive crimp disk, the plurality of semi-flexible conductive crimp fingers angled away from the plane in a direction toward the conductive connection element and away from the projecting portion, whereby the crimp fingers enabling a guiding means for directing the projecting portion to the central recess during an assembly.

According to another alternative embodiment of the present invention there is provided a connection system, further comprising: a crimp connection member on the contact element, the crimp connection member including at least one deformable member for securing at least a portion of the second end of the conductive connection element to the contact element, the second means for forming further comprising: a plurality of semi-flexible conductive crimp fingers projecting from the conductive crimp disk, the fingers defining a central recess for receiving the projecting portion of the exterior connection element, and the central recess for receiving having an inner opening dimension less than an outer dimension of the projecting portion, whereby at least one of the plurality of conductive crimp fingers semi-flexibly engages and frictionally contacts the projecting portion, and secure an electrically conductive connection to the exterior connection element.

According to another alternative embodiment of the present invention there is provided a connection system, further comprising: a fastening peg member on the first end of the conductive connection element, securing means for pivotally and elastically securing the fastening peg of the conductive connection element to the power semiconductor element, spring means for elastically urging the fastening peg member into a pressure contact connection with the securing means, and the spring means pivotally secured within the securing means, whereby the connection system enables a secure and reliable electrical connection between the power semiconductor element sand the conductive connection element.

According to another alternative embodiment of the present invention there is provided a connection system, wherein: the power semiconductor element is arranged in an interior of a bounding housing as a disk cell, the exterior connection location is arranged on an exterior of the housing, the projecting portion of the exterior connection element sealably projecting into the interior of the bounding housing and enabling an electrical connection from the projecting portion to the exterior connection location, and the bounding housing being hermetically sealed from the exterior of the housing.

According to another alternative embodiment of the present invention there is provided a connection system wherein: the securing means for pivotally and elastically securing includes a non-conductive outer guard portion, whereby the peg member is ensured an electrical connection with the power semiconductor element without external interference.

The above, and other objects, features and advantages of the present invention will become apparent from the following description read in conduction with the accompanying drawings, in which like reference numerals designate the same elements.

DETAILED DESCRIPTION OF THE PREFERRED EMBODIMENTS

Figure 1:
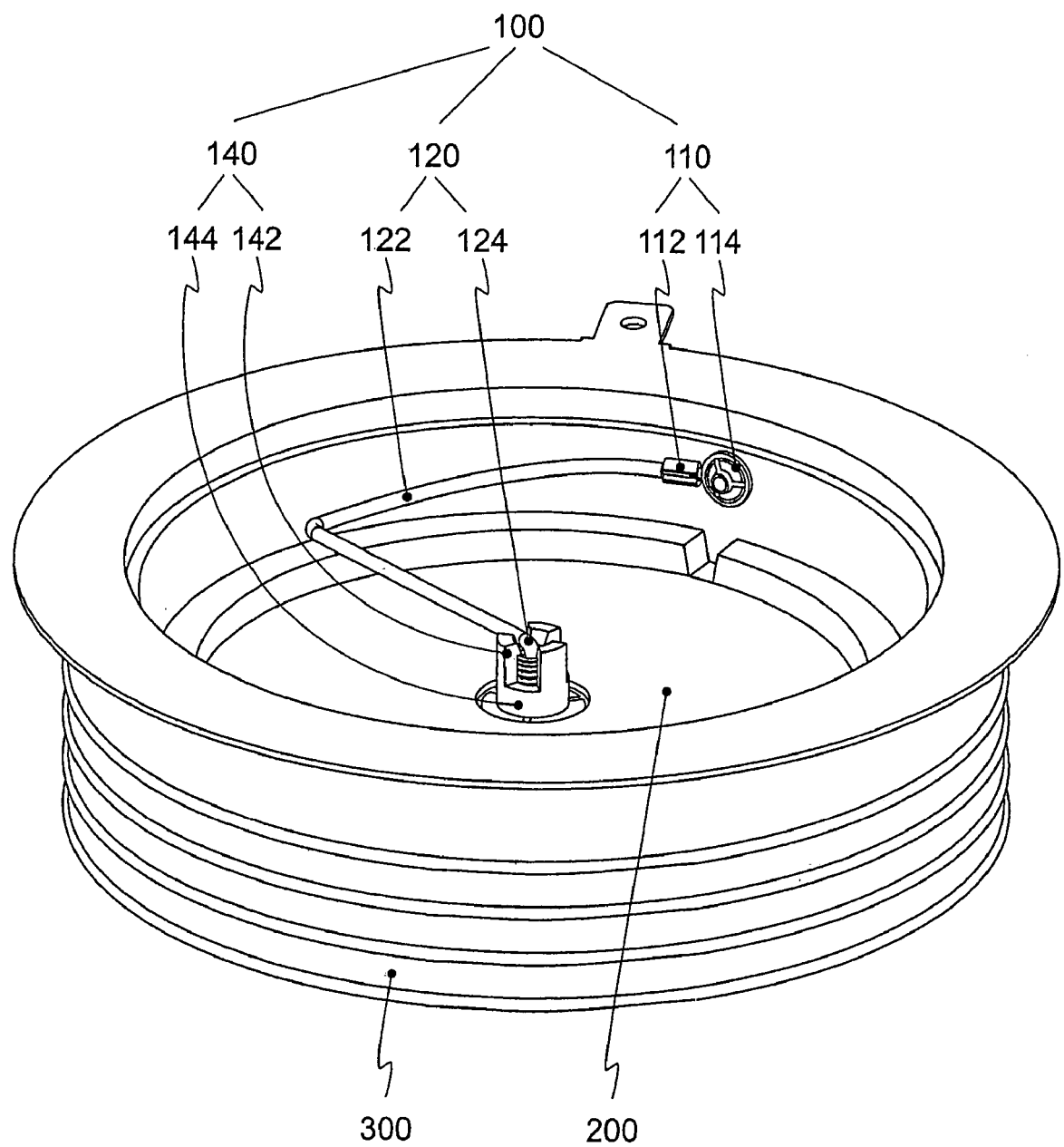
FIG. 1 is a perspective view of a disk cell according to one embodiment of the present invention.

Reference will now be made in detail to several embodiments of the invention that are illustrated in the accompanying drawings. Wherever possible, same or similar reference numerals are used in the drawings and the description to refer to the same or like parts or steps, unless otherwise directed by the written discussion. The drawings are in simplified form and are not to precise scale. For purposes of convenience and clarity only, directional terms, such as top, bottom, up, down, over, above, and below may be used with respect to the drawings. These and similar directional terms should not be construed to limit the scope of the invention in any manner. The words "connect," "couple," "snap," and similar terms with their inflectional morphemes do not necessarily denote direct and immediate connections, but also include connections through mediate elements or devices.

Referring now to FIG. 1, a view of the inside of an exemplary power semiconductor module, in this case a disk cell, is provided. Shown is a ceramic housing 300, having arranged therein a power semiconductor component 200 in this case a power thyristor. The power thyristor 200 has a centrally located auxiliary connection contact, in this case the control connection contact. The remaining area is used as a load, in this case a cathode contact. Its load connection to the exterior is not shown, but corresponds substantially to the state of the art, i.e. it has a recess for arranging the auxiliary connection 100.

Auxiliary connection 100 itself is comprised of a contact device 140, a conductive connection element 120 and a contact element 110 that is partially a crimp disk 114 having projecting crimp lips or fingers 116. As shown, but not required, the connection element is a contact peg 124 with a connecting wire element 122. Since, as shown crimp lips or fingers 116 extend from the plain of crimp disk 114 they enable a secure elastic contact with conductive connection 120

Contact peg 124 is fastened and guided by means of the contact device 140. Contact device 140 is comprised of a plastic preform member 144 and a spring element 142, as shown.

The design of contact peg 124 is such that following the assembly of the disk cell pressure is exerted on the contact device 120 which in turn pushes the contact peg 130 onto the auxiliary connection contact of the power semiconductor component 200 and thus provides a secure and durable electric contact with the auxiliary connection 100.

The second end of the auxiliary contact 100 forms the contact element 110. The design of the contact element is that of a metal preform or shaped element with a crimp connection 112. This means wire element 122 has a bare end that is inserted in wire element 122 and is electrically connected via a crimping and closing of crimp connection 112. The contact element 110 furthermore has a crimp disk 114 that is arranged on a pen-type metal preform of an exterior connection element and allows an elastic spring/ crimp connection with crimp fingers or lips 116 by surrounding the internal projecting portion of the exterior connection element during an assembly.

Figure 2:
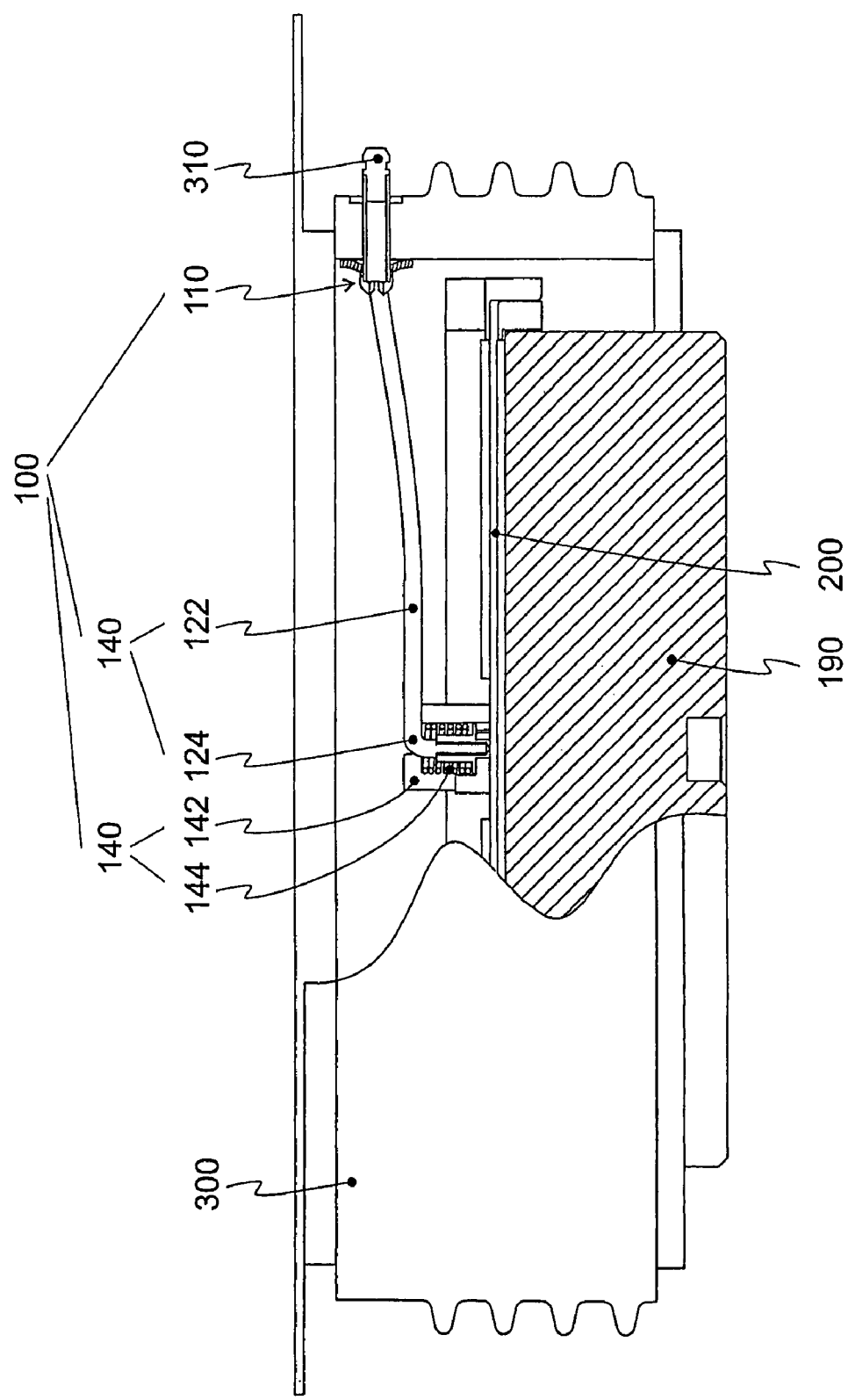
FIG. 2 is a partially cut-away side view of FIG. 1.

Referring now to FIG. 2 a section through the middle of the disk cell according to FIG. 1 is provided. Also shown is the cylinder-shaped housing 300 whose exterior surface is wave-shaped for reasons of electric safety. Housing 300 has an exterior connection element 310. Connection element 310 is shaped like a pen-type metal preform in the interior of the housing 300, as shown. A main connection element 190 of the anode here is a metal cylinder on which an additional metal disk preferably made of molybdenum is provided (as shown), and on it power semiconductor component 200 is arranged.

Auxiliary connection 100 for the connection of the auxiliary connection contact of power semiconductor component 200 with exterior connection element 310 in turn is comprised of contact device 140, conductive connection element 120 and contact element 110. The arrangement of contact element 110 on the pen-type metal preform of exterior connection element 310 is also shown.

Due to this embodiment of auxiliary connection 100 in accordance with the invention it [the auxiliary connection] in the area of exterior connection element 310 only extends somewhat into the interior space of the disk cell and thus leaves sufficient space for the load connection element of the cathode that is not shown. By means of this load connection element plastic preform 142 of contact device 140 is pressed downwardly in the direction of power semiconductor component 200. This downward causes spring element 144 to exert pressure on contact peg 124, which in turn is safely and durably connected with the auxiliary connection of power semiconductor component 200.

As an alternative to the above embodiment, auxiliary connection 100 also can be based on a substrate that is designed as an auxiliary plate in the interior of the housing. This substrate then has at least one metal surface that is connected to the control connection of the semiconductor component by means of a wire bond connection in a conductive manner. Thus it should be understood by those of skill in the art that the present construction may be adapted to alternative geometries without departing from the spirit and scope of the present invention.

Figure 3:
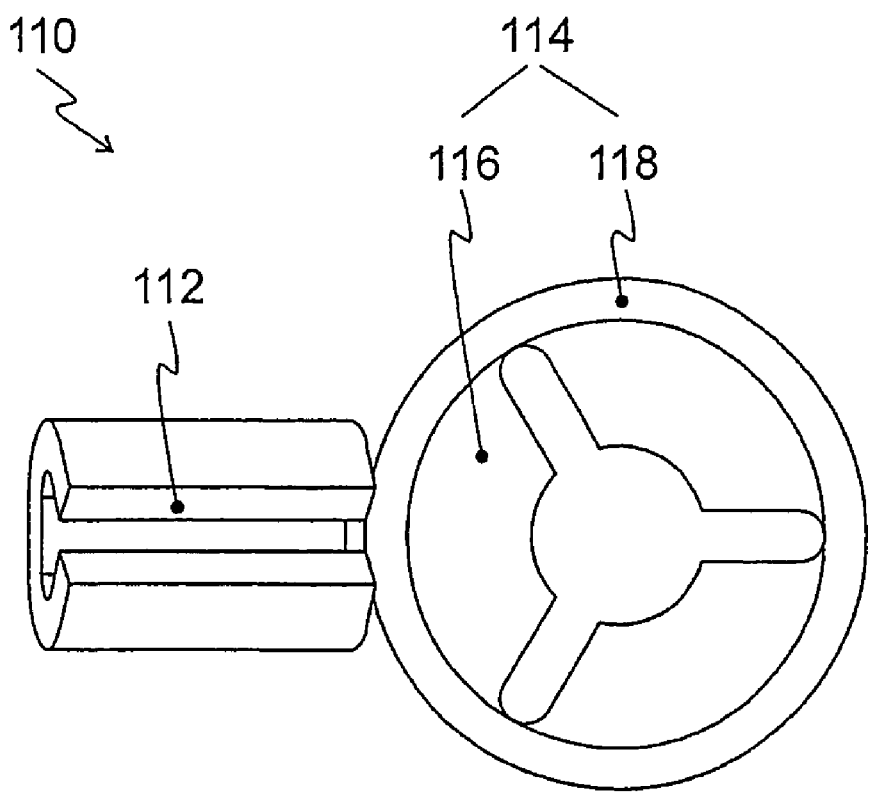
FIG. 3 is a top view of a contact element according to one aspect of the present invention for connecting an auxiliary connection with an external connection element.
Figure 4:
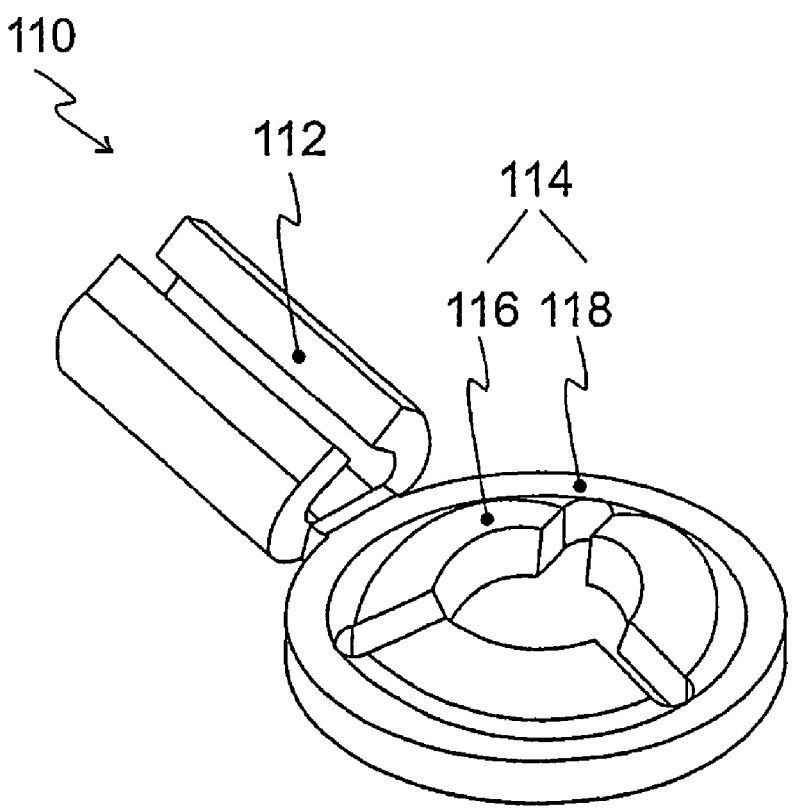
FIG. 4. is a perspective view of the contact element in FIG. 3.

Referring now to FIGS. 3 and 4, top and prospective views of contact element 110 are provided according to one embodiment of the present invention. Contact element 110 is the connection element of auxiliary connection 100 with an exterior connection element 310. Contact element 110 is a conductive, and preferably metal preform with a crimp connection 112 to provide a crimp-connection with connection element 120 that is optionally a wire element and a crimp disk 114.

Crimp disk 114 is comprised of an exterior ring 118 with a plurality, of preferably three or more exposed crimp lips or fingers 116 for elastically catching an extending portion of the exterior connection element 310. A diameter of the central recess of the crimp disk 114 preferably is around 0.1 mm to 0.5 mm smaller than the diameter of the pen-type metal preform of the exterior connection element 310 (referring to FIG. 2) and thus when pressed over element 310, crimp lips or fingers 116 flex relative to exterior ring 118 and elastically, frictionally, and electrically engage contact element 310 without requiring soldering or other means to ensure a reliable electrical contact therewith.

It is especially preferred when crimp lips or fingers 116 are bent from the plane formed by the exterior ring 118 in the direction of the interior of the power semiconductor module to provide additional spring and an urging of exterior ring 118 onto the support surface proximate element 310.

It has been found especially advantageous when the tangent of the angle of crimp lips or fingers 116 in relation to the plane is smaller than a sliding friction factor between the materials of the pen-type preform of exterior connection element 310 and crimp disk 114. The angle area of the forward bend for crimp lips or fingers 116 then ranges between this limit angle and half the limit angle. Thus, this design simplifies the assembly of the pen-type metal preform on exterior connection element 310 and prevents it from sliding off.

It should be recognized that as employed herein as discussed power semiconductor element 200 may also be referred to as a substrate depending upon geometric construction of the power semiconductor element.

In the claims, means- or step-plus-function clauses are intended to cover the structures described or suggested herein as performing the recited function and not only structural equivalents but also equivalent structures. Thus, for example, although a nail, a screw, and a bolt may not be structural equivalents in that a nail relies on friction between a wooden part and a cylindrical surface, a screw's helical surface positively engages the wooden part, and a bolt's head and nut compress opposite sides of a wooden part, in the environment of fastening wooden parts, a nail, a screw, and a bolt may be readily understood by those skilled in the art as equivalent structures.

Having described at least one of the preferred embodiments of the present invention with reference to the accompanying drawings, it is to be understood that the invention is not limited to those precise embodiments, and that various changes, modifications, and adaptations may be effected therein by one skilled in the art without departing from the scope or spirit of the invention as defined in the appended claims.

The invention claimed is:

1. A power semiconductor module, said power semiconductor module including a housing, at least one power semiconductor element arranged in an interior region of said housing, and at least one auxiliary connection, wherein:
    said at least one auxiliary connection extends between at least one of said power semiconductor element and a substrate, and a corresponding exterior connection element;
    said at least one exterior connection element penetrating said housing to an exterior region and enabling an electrical connection thereto;
    said at least one exterior connection element including a pen-type metal preform projecting into said interior region;
    said auxiliary connection further comprising:
        a contact device contacting an auxiliary connection contact of said one of said power semiconductor element and said substrate, a conductive connection element, and a contact element; and
    said contact element including a crimp disk means for engaging said exterior connection element in a spring-crimp electrical connection, whereby a reliable electrical connection is enabled spanning said interior region.

2. A power semiconductor module, according to claim 1, wherein:
    said contact element crimp disk means for engaging includes a first crimp connection means for engaging a wire element of said contact device and an exterior ring member further comprising a plurality of exposed crimp lips members.

3. A power semiconductor module, according to claim 2, wherein:
    said crimp lip member are bent forward from a plane formed by said exterior ring member contacting said interior region of said power semiconductor module.

4. A power semiconductor module, according to claim 1, wherein:
    said contact device further comprises:
        a plastic preform member on said auxiliary connection contact member of said power semiconductor component for fastening a contact peg member and a spring element, thereby providing an urging pressure contact connection on said contact peg member with said auxiliary connection contact of said power semiconductor component.

5. A power semiconductor module, according to claim 1, wherein:
said power semiconductor module is a disk cell;
said housing further comprises:
means for hermetically sealing said interior region of said housing with said exterior connection element; and
said substrate is an auxiliary plate in said interior region of said housing.

6. A connection system, for electrically connecting at least one power semiconductor element in an interior region of a bounding housing with an exterior region of said housing, comprising:
an exterior connection element electrically penetrating said bounding housing from said exterior region and enabling an electrical connectivity with said interior region;
at least one means for enabling an elastic electrical connection between said exterior connection element and said at least one power semiconductor element;
said means for enabling an elastic electrical connection, further comprising:
a contact element;
an auxiliary connection contact;
said auxiliary connection contact electrically connecting between said at least one power semiconductor element at a first end and said contact element at a second end;
means for forming a first crimp engagement between said second end of said auxiliary connection contact and said contact element; and
means for forming a second elastic crimp engagement with a portion of said exterior connection element, whereby said means for enabling ensures a quickly assembled elastic electrical connection between said exterior connection element and said at least one contact element.

7. A connection system, according to claim 6, wherein:
said first end of said auxiliary connection contact includes a cylindraceous electrical contact region;
said means for forming a first crimp engagement further comprises:
a plurality of flexible crimp members for bounding an outer surface of said cylindraceous electrical contact region of said first end;
said means for forming a second elastic crimp engagement on said contact element further comprises:
a plurality of flexible crimping lips extending inwardly from an outer crimp ring and defining a receiving region there between for elastically crimping said second end of said exterior connection element electrically, whereby said means for forming a second elastic crimp engagement enables a reliable non-rigid electrical connection with said at least one power semiconductor element.

8. A connection system, according to claim 7, wherein:
a contact surface is defined between said outer crimp ring and an inner surface of said bounding housing;
said plurality of flexible crimping lips projecting away from said contact surface at a first angle for elastically crimping said second end of said exterior connection element.

9. A connection system, according to claim 7, wherein:
said auxiliary connection contact includes a fastening peg member on said first end of said contact element for electrically contacting said power semiconductor element;
securing means for pivotally and elastically securing said fastening peg member element to said power semiconductor element;
spring means for elastically urging said fastening peg member into a pressure contact connection with said power semiconductor element; and
said spring means pivotally secured within said securing means, whereby said connection system enables a secure and reliable electrical connection between said power semiconductor element sand said exterior connection element.

10. A connection system, according to claim 7, further comprising:
means for hermetically sealing said bounding housing from said exterior region of said housing, whereby said means for hermetically sealing minimizes unintended contamination of said interior region.

11. A connection system, for enabling an electrical connection between a power semiconductor element and an exterior connection location, comprising:
a conductive connection element for electrically conducting from said power semiconductor element at a first end, to said exterior connection location a second end;
a contact device proximate said first end of said conductive connection element including first means for elastically and electrically contacting said first end of said connection element to said power semiconductor element;
a contact element proximate said second end of said conductive connection element for electrically contacting said conductive connection element to at least one exterior connection element proximate said exterior connection location;
said contact element including at least a conductive crimp disk portion; and
second means for forming an elastic and electrically secure electrical connection between a projecting portion of said exterior connection element and said second end of said conductive connection element.

12. A connection system, according to claim 11, further comprising:
a crimp connection member on said contact element; and
said crimp connection member including at least one deformable member for securing at least a portion of said second end of said conductive connection element to said contact element.

13. A connection system, according to claim 11, wherein:
said second means for forming further comprises:
a plurality of semi-flexible conductive crimp fingers projecting from said conductive crimp disk;
said fingers defining a central recess for receiving said projecting portion of said exterior connection element; and
said central recess for receiving having an inner opening dimension less than an outer dimension of said projecting portion, whereby at least one of said plurality of conductive crimp fingers semi-flexibly engages and frictionally contacts said projecting portion, and secure an electrically conductive connection to said exterior connection element.

14. A connection system, according to claim 13, wherein:
a plane is defined along bottom surface of said conductive crimp disk;
said plurality of semi-flexible conductive crimp fingers angled away from said plane in a direction toward said conductive connection element and away from said projecting portion, whereby said crimp fingers enabling a guiding means for directing said projecting portion to said central recess during an assembly.

15. A connection system, according to claim 11, further comprising:
a crimp connection member on said contact element;
said crimp connection member including at least one deformable member for securing at least a portion of said second end of said conductive connection element to said contact element;
said second means for forming further comprising:
a plurality of semi-flexible conductive crimp fingers projecting from said conductive crimp disk;
said fingers defining a central recess for receiving said projecting portion of said exterior connection element; and
said central recess for receiving having an inner opening dimension less than an outer dimension of said projecting portion, whereby at least one of said plurality of conductive crimp fingers semi-flexibly engages and frictionally contacts said projecting portion, and secure an electrically conductive connection to said exterior connection element.

16. A connection system, according to claim 11, further comprising:
a fastening peg member on said first end of said conductive connection element;
securing means for pivotally and elastically securing said fastening peg of said conductive connection element to said power semiconductor element;

spring means for elastically urging said fastening peg member into a pressure contact connection with said securing means; and
said spring means pivotally secured within said securing means, whereby said connection system enables a secure and reliable electrical connection between said power semiconductor element sand said conductive connection element.

17. A connection system, accord to claim 11, wherein:
said power semiconductor element is arranged in an interior of a bounding housing as a disk cell;
said exterior connection location is arranged on an exterior of said housing;
said projecting portion of said exterior connection element sealably projecting into said interior of said bounding housing and enabling an electrical connection from said projecting portion to said exterior connection location; and
said bounding housing being hermetically sealed from said exterior of said housing.

18. A connection system, according to claim 16, wherein:
said securing means for pivotally and elastically securing includes a non-conductive outer guard portion, whereby said peg member is ensured an electrical connection with said power semiconductor element without external interference.

* * * * *